(12) United States Patent
Tam

(10) Patent No.: US 10,411,910 B2
(45) Date of Patent: Sep. 10, 2019

(54) DISTRIBUTED CONTROL SYNCHRONIZED RING NETWORK ARCHITECTURE

(71) Applicant: DeGirum Corporation, Menlo Park, CA (US)

(72) Inventor: Kit S. Tam, Menlo Park, CA (US)

(73) Assignee: DeGirum Corporation, Campbell, CA (US)

( * ) Notice: Subject to any disclaimer, the term of this patent is extended or adjusted under 35 U.S.C. 154(b) by 0 days.

(21) Appl. No.: 15/816,235

(22) Filed: Nov. 17, 2017

(65) Prior Publication Data

US 2018/0145849 A1  May 24, 2018

Related U.S. Application Data

(60) Provisional application No. 62/425,792, filed on Nov. 23, 2016.

(51) Int. Cl.
*H04L 12/42* (2006.01)
*H04L 7/00* (2006.01)
*H04L 7/04* (2006.01)
*H04J 3/06* (2006.01)

(52) U.S. Cl.
CPC .......... *H04L 12/422* (2013.01); *H04J 3/0638* (2013.01); *H04L 7/0008* (2013.01); *H04L 7/0037* (2013.01); *H04L 7/04* (2013.01)

(58) Field of Classification Search
None
See application file for complete search history.

(56) References Cited

U.S. PATENT DOCUMENTS

| 5,539,727 | A | * | 7/1996 | Kramarczyk | H04L 12/42 370/222 |
| 5,815,016 | A | | 9/1998 | Erickson | |
| 6,523,155 | B1 | * | 2/2003 | Ruedinger | G06F 17/5022 703/23 |
| 7,280,550 | B1 | * | 10/2007 | Rosenboom | H04J 3/0682 370/404 |
| 8,261,218 | B1 | * | 9/2012 | Fung | G06F 17/5054 716/108 |
| 9,209,961 | B1 | * | 12/2015 | Notani | H03K 5/14 |
| 2002/0176315 | A1 | * | 11/2002 | Graaff | G11C 7/1066 365/233.1 |

(Continued)

*Primary Examiner* — Jeffrey M. Rutkowski
*Assistant Examiner* — Andre Tacdiran
(74) *Attorney, Agent, or Firm* — Bever, Hoffman & Harms, LLP

(57) ABSTRACT

A ring network architecture includes multiple communication nodes configured in a ring. Wave pipelining is used to provide for high bandwidth and low latency on-chip communications. Each node implements a source-synchronized clocking scheme, such that there is no need to build an extensive low skew clock-tree across a large die area. A single reference clock signal is generated within a root node, and is routed through each of the nodes of the ring network in a unidirectional manner. Each node includes a timestamp counter and a color bit register, which store values that enable the node to resolve ordered transaction messages issued by the other nodes in a precise order, even though the nodes are operating independently, and receive the various transaction messages in totally different timing orders. Because the control logic is distributed among the nodes, no centralized controller is necessary.

16 Claims, 15 Drawing Sheets

(56) References Cited

U.S. PATENT DOCUMENTS

| | | | |
|---|---|---|---|
| 2003/0096577 A1 | 5/2003 | Heinonen et al. | |
| 2003/0160797 A1* | 8/2003 | Koltzoff | H04L 7/0008 345/581 |
| 2003/0172190 A1* | 9/2003 | Greenblat | H04L 12/422 709/251 |
| 2006/0098682 A1 | 5/2006 | Nichols | |
| 2007/0237153 A1 | 10/2007 | Slaughter et al. | |
| 2008/0025344 A1 | 1/2008 | Biederman et al. | |
| 2008/0140891 A1 | 6/2008 | Fong et al. | |
| 2009/0100189 A1* | 4/2009 | Bahren | H04L 12/422 709/231 |
| 2010/0262788 A1* | 10/2010 | Tsien | G06F 12/0831 711/146 |
| 2012/0072759 A1* | 3/2012 | Wu | H03M 9/00 713/401 |
| 2012/0287344 A1* | 11/2012 | Choi | H04N 5/265 348/705 |
| 2013/0279525 A1 | 10/2013 | Zheng et al. | |
| 2014/0079074 A1* | 3/2014 | Tune | H04L 45/00 370/401 |
| 2014/0079393 A1 | 3/2014 | Wolfe et al. | |
| 2014/0125381 A1* | 5/2014 | Schreiber | G06F 17/5045 326/93 |
| 2014/0266369 A1* | 9/2014 | Brunolli | H03K 3/0375 327/211 |
| 2015/0178831 A1* | 6/2015 | Bonig | G06Q 40/04 705/37 |
| 2015/0192949 A1* | 7/2015 | Wu | H04L 7/0004 713/503 |
| 2016/0116935 A1* | 4/2016 | Josiassen | G06F 1/04 713/500 |
| 2016/0241480 A1* | 8/2016 | Rochon | H04L 45/745 |
| 2017/0006362 A1* | 1/2017 | Shang | H04B 10/0793 |
| 2017/0272378 A1* | 9/2017 | Huang | H04L 47/70 |
| 2017/0285683 A1* | 10/2017 | Lin | G06F 13/4022 |

\* cited by examiner

| ACTION | N0 (CPU_0) | N1 | N2 | N3 (CPU_1) | N4 | N5 (MEMORY) |
|---|---|---|---|---|---|---|
| MESSAGE BUS | M*0_5(0) | M*0_5(0) | | M*2_4(0) | | |
| MESSAGE SNOOPER | M*0_5(0) | M*0_5(0) | M*2_4(0) | M*2_4(0) | | |
| TS_COUNT | 1 | 0→1 | 1 | 0→1 | 0 | 0 |
| COLOR BIT | 1 | 1 | 1 | 1 | 1 | 0→1 |
| PULSE LOCATION | | | | | | X |

FIG. 8B

|  | N0 (CPU_0) | N1 | N2 | N3 (CPU_1) | N4 | N5 (MEMORY) |
|---|---|---|---|---|---|---|
| ACTION |  |  |  | CPU_1 SENDS EXCLUSIVE REQUEST FOR CACHE LINE 'A' TO NODE N5 |  |  |
| MESSAGE BUS |  |  | M*0_5(0) | M*3_5(1) | M*2_4(0) |  |
| MESSAGE SNOOPER | M*0_5(0) | M*0_5(0) | M*2_4(0) M*0_5(0) | M*2_4(0) M*3_5(1) | M*2_4(0) |  |
| TS_COUNT | 1 | 1 | 1 → 2 | 1 → 2 | 0 → 1 | 0 |
| COLOR BIT | 1 → 0 | 1 | 1 | 1 | 1 | 1 |
| PULSE LOCATION | X |  |  |  |  |  |

FIG. 8C

| ACTION | N0 (CPU_0) | N1 | N2 | N3 (CPU_1) | N4 | N5 (MEMORY) |
|---|---|---|---|---|---|---|
| MESSAGE BUS | M*0_5(0) | M*0_5(0) | | M*0_5(0) | M*3_5(1) | M*2_4(0) |
| MESSAGE SNOOPER | | | M*2_4(0) M*0_5(0) | M*2_4(0) M*3_5(1) M*0_5(0) | M*2_4(0) M*3_5(1) | M*2_4(0) |
| TS_COUNT | 1 | 1 | 2 | 2 → 3 | 1 → 2 | 0 → 1 |
| COLOR BIT | 0 | 1 → 0 | 1 | 1 | 1 | 1 |
| PULSE LOCATION | | X | | | | |

| ACTION | N0 (CPU_0) | N1 | N2 | N3 (CPU_1) | N4 | N5 (MEMORY) |
|---|---|---|---|---|---|---|
| MESSAGE BUS | M*2_4(0) | | | | | |
| MESSAGE SNOOPER | M*0_5(0) M*2_4(0) | M*0_5(0) | M*2_4(0) M*0_5(0) | M*2_4(0) M*3_5(1) M*0_5(0) | M*0_5(0) M*2_4(0) M*3_5(1) M*0_5(0) | M*3_5(1) M*2_4(0) M*3_5(1) |
| TS_COUNT | 1→2 | 1 | 2 | 3 | 2→3 | 1→2 |
| COLOR BIT | 0 | 0 | 1→0 | 1 | 1 | 1 |
| PULSE LOCATION | | | X | | | |

FIG. 8E

| ACTION | N0 (CPU_0) | N1 | N2 | N3 (CPU_1) | N4 | N5 (MEMORY) |
|---|---|---|---|---|---|---|
| MESSAGE BUS | M*3_5(1) | M*2_4(0) | | | | |
| MESSAGE SNOOPER | M*0_5(0) M*2_4(0) M*3_5(1) | M*0_5(0) M*2_4(0) | M*2_4(0) M*0_5(0) | M*2_4(0) M*3_5(1) M*0_5(0) | M*2_4(0) M*3_5(1) M*0_5(0) | M*0_5(0) M*2_4(0) M*3_5(1) M*0_5(0) |
| TS_COUNT | 2 → 3 | 1 → 2 | 2 | 3 | 3 | 2 → 3 |
| COLOR BIT | 0 | 0 | 0 | 1 → 0 | 1 | 1 |
| PULSE LOCATION | | | | X | | |

FIG. 8F

| ACTION | N0 (CPU_0) | N1 | N2 | N3 (CPU_1) | N4 | N5 (MEMORY) |
|---|---|---|---|---|---|---|
| MESSAGE BUS | M*0_5(0) LOOPS BACK TO N0 | | M*2_4(0) LOOPS BACK TO N2 | | N4 RESOLVES CONTENTS OF MESSAGE SNOOPER | |
| MESSAGE SNOOPER | M*0_5(0) | M*3_5(1) | M*2_4(0) | | | |
| MESSAGE SNOOPER | M*0_5(0) M*2_4(0) M*3_5(1) | M*0_5(0) M*2_4(0) M*3_5(1) | M*2_4(0) M*0_5(0) | M*2_4(0) M*3_5(1) M*0_5(0) | M*2_4(0) M*3_5(1) M*0_5(0) | M*2_4(0) M*3_5(1) M*0_5(0) |
| TS_COUNT | 3 | 2→3 | 2 | 3 | 3 | 3 |
| COLOR BIT | 0 | 0 | 0 | 0 | 1→0 | 1 |
| PULSE LOCATION | | | | | X | |

FIG. 8G

| ACTION | N0 (CPU_0) | N1 | N2 | N3 (CPU_1) | N4 | N5 (MEMORY) |
|---|---|---|---|---|---|---|
| | | | | | | N5 RESOLVES CONTENTS OF MESSAGE SNOOPER |
| MESSAGE BUS | | | M*3_5(1) | | | |
| MESSAGE SNOOPER | M*0_5(0) M*2_4(0) M*3_5(1) | M*0_5(0) M*2_4(0) M*3_5(1) | M*2_4(0) M*0_5(0) M*3_5(1) | M*2_4(0) M*3_5(1) M*0_5(0) | M*2_4(0) M*3_5(1) M*0_5(0) | M*2_4(0) M*3_5(1) M*0_5(0) |
| TS_COUNT | 3 | 3 | 2→3 | 3 | 3 | 3 |
| COLOR BIT | 0 | 0 | 0 | 0 | 0 | 1→0 |
| PULSE LOCATION | | | | | | X |

FIG. 8H

| ACTION | N0 (CPU_0) | N1 | N2 | N3 (CPU_1) | N4 | N5 (MEMORY) |
|---|---|---|---|---|---|---|
| | | | | M*3_5(1) LOOPS BACK TO N3 | | |
| MESSAGE BUS | M*0_5(0) M*2_4(0) M*3_5(1) | M*0_5(0) M*2_4(0) M*3_5(1) | M*2_4(0) M*0_5(0) M*3_5(1) | M*3_5(1) | | |
| MESSAGE SNOOPER | | | | M*2_4(0) M*3_5(1) M*0_5(0) | M*2_4(0) M*3_5(1) M*0_5(0) | M*2_4(0) M*3_5(1) M*0_5(0) |
| TS_COUNT | 3 | 3 | 3 | 3 | 3 | 3 |
| COLOR BIT | 0→1 | 0 | 0 | 0 | 0 | 0 |
| PULSE LOCATION | X | | | | | |

FIG. 8I

DISTRIBUTED CONTROL SYNCHRONIZED RING NETWORK ARCHITECTURE

RELATED APPLICATIONS

This application claims priority from U.S. Provisional Patent Application 62/425,792, entitled "Distributed Control Synchronized Ring Network Architecture", which was filed on Nov. 23, 2016, and is incorporated by reference herein.

FIELD OF THE INVENTION

The present invention relates to an improved ring network architecture for achieving high bandwidth and low latency on-chip communications.

RELATED ART

A conventional semiconductor chip may include an extensive low-skew clock tree that distributes a global clock signal to each of a plurality of circuit blocks fabricated on the chip. The clock tree is designed to ensure that each of the plurality of circuit blocks receives the same input clock signal as each of the other circuit blocks. Implementing such a global clock tree requires extensive layout (die) area and a relatively complex interconnect structure (to enable point-to-point communication, broadcast communication, arbitration and synchronization). Pipeline stages are included along the interconnect structure to maintain a minimum delay. In addition, a centralized controller is required to establish and control the global clock tree. As a result of these structures, the global clock tree consumes a significant amount of power.

Despite the above-described controls, clock skew may eventually degrade the performance of the global clock tree. The variance of the physical distance among all the communication agents makes eliminating this clock skew difficult.

It would therefore be desirable to have an improved method and structure for implementing clock synchronization on a semiconductor chip. It would be desirable for this improved method and structure to be capable of providing high frequency, low latency operation on a semiconductor chip, without requiring a centralized controller. It would further be desirable for this improved method and structure to have a simply physical implementation, which does not require the use of a low-skew, high power consumption clock tree over a large area of the semiconductor chip.

SUMMARY

Accordingly, the present invention provides a ring network architecture, wherein multiple communication nodes are configured in a ring. The ring network architecture uses wave pipelining to provide for high bandwidth and low latency on-chip communications. A very high operating frequency can be achieved using the ring network architecture of the present invention. For example, assume each of the communication nodes includes node logic for forwarding messages on the ring network, wherein the node logic includes less than 12 levels of logic with a fan-out of four (FO4), with each logic gate having a 100 picosecond (ps) gate delay. In this case, the ring network architecture of the present invention is capable of providing data transfer frequencies of 5 GHz or more, even considering wire delays between nodes.

In accordance with one embodiment, each of the nodes of the ring network implements a source-synchronized clocking scheme, such that there is no need to build an extensive low skew clock-tree across a large die area. The required control logic is distributed among the nodes, such that no centralized controller is necessary. The clocking and control schemes implemented by the ring network architecture of the present invention significantly simplify the physical implementation of the network, while allowing for very high speed operation.

In accordance with one embodiment, a reference clock signal is generated within a root node of the ring network. This reference clock signal is routed through each of the nodes of the ring network in a uni-directional manner. Messages are transmitted between the nodes with the reference clock signal, wherein each message received by a node is clocked into the node using the corresponding received reference clock signal. Each node of the ring network includes a timestamp counter and a color bit register. The timestamp counter of each node is updated using the received reference clock signal each time a node generates and transmits an original ordered message, and each time a node receives an ordered message that it did not originally generate. A pulse message continuously cycles through the nodes of the ring network, wherein the pulse message toggles the color bit register of a node each time the pulse message is received by the node. Each of the timestamp counters and color bit registers is initialized prior to normal operation, such that each timestamp counter stores an identical timestamp value and each color bit register stores an identical color bit value. The timestamp values and color bit values enable each node to resolve the transaction messages issued by the other nodes in a precise order, even though the nodes are operating independently, and receive the various transaction messages in totally different timing orders. This capability provides a powerful instrument for arbitration and synchronization.

In one embodiment, each node appends a timestamp value from its timestamp counter to each ordered message generated. Each node further includes a message snooper that stores the ordered messages received on the ring network. When the color bit is toggled within a node, the node analyzes the ordered messages stored in its message snooper, and awards priority to the ordered message having the oldest timestamp value.

The ring network architecture of the present invention can be used, for example, to implement a MOSEI (Modified Owned Shared Exclusive Invalid) cache coherence protocol memory bus or a communication network on a massive parallel processor.

The present invention will be more fully understood in view of the following description and drawings.

BRIEF DESCRIPTION OF THE DRAWINGS

FIGS. 8A, 8B, 8C, 8D, 8E, 8F, 8G, 8H and 8I are tables that illustrate the status of the ring network during the transmission of a point-to-point ordered message in accordance with one embodiment of the present invention.

DETAILED DESCRIPTION

Figure 1:
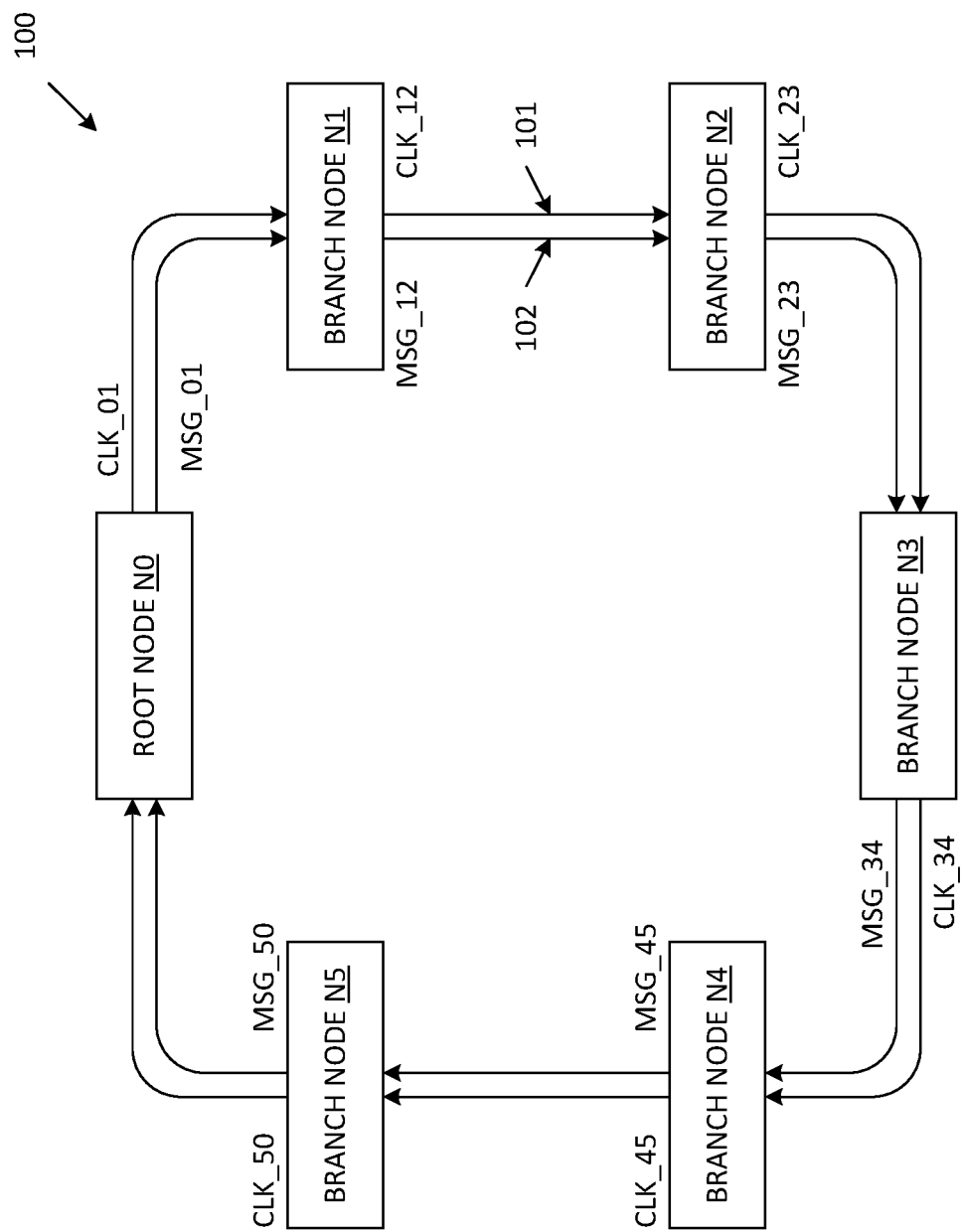
FIG. 1 is a block diagram of a distributed control synchronized ring network in accordance with one embodiment of the present invention.

FIG. 1 is a block diagram of a distributed control synchronized ring network 100 in accordance with one embodiment of the present invention. Ring network 100 includes root node N0 and branch nodes N1-N5, which are connected in a ring. Although six communication nodes N0-N5 are included in the described examples, it is understood that other numbers of nodes can be included in other embodiments. However, each ring network will include one root node and one or more branch nodes. Each of the nodes N0-N5 receives a corresponding clock input signal and corresponding message input signals, and transmits a corresponding clock output signal and corresponding message output signals. The signals of the ring network 100 are unidirectional. In the illustrated embodiments, the signals of ring network 100 are routed in a clockwise manner (although this is not necessary). Each of the nodes N0-N5 has a transmitting neighbor and a receiving neighbor. For example, branch node N3 includes transmitting neighbor N2, and receiving neighbor N4. Nodes N0, N1, N2, N3, N4 and N5 transmit clock signals CLK_01, CLK_12, CLK_23, CLK_34, CLK_45 and CLK_50, respectively, and corresponding output messages MSG_01, MSG_12, MSG_23, MSG_34, MSG_45, and MSG_50, respectively, to receiving neighbors N1, N2, N3, N4, N5 and N0, respectively. The clock signals CLK_01, CLK_12, CLK_23, CLK_34, CLK_45 and CLK_50 are transmitted on a clock path 101 of the ring network 100, and the messages MSG_01, MSG_12, MSG_23, MSG_34, MSG_45, and MSG_50 are transmitted on a message bus 102 of the ring network 100.

Figure 2:
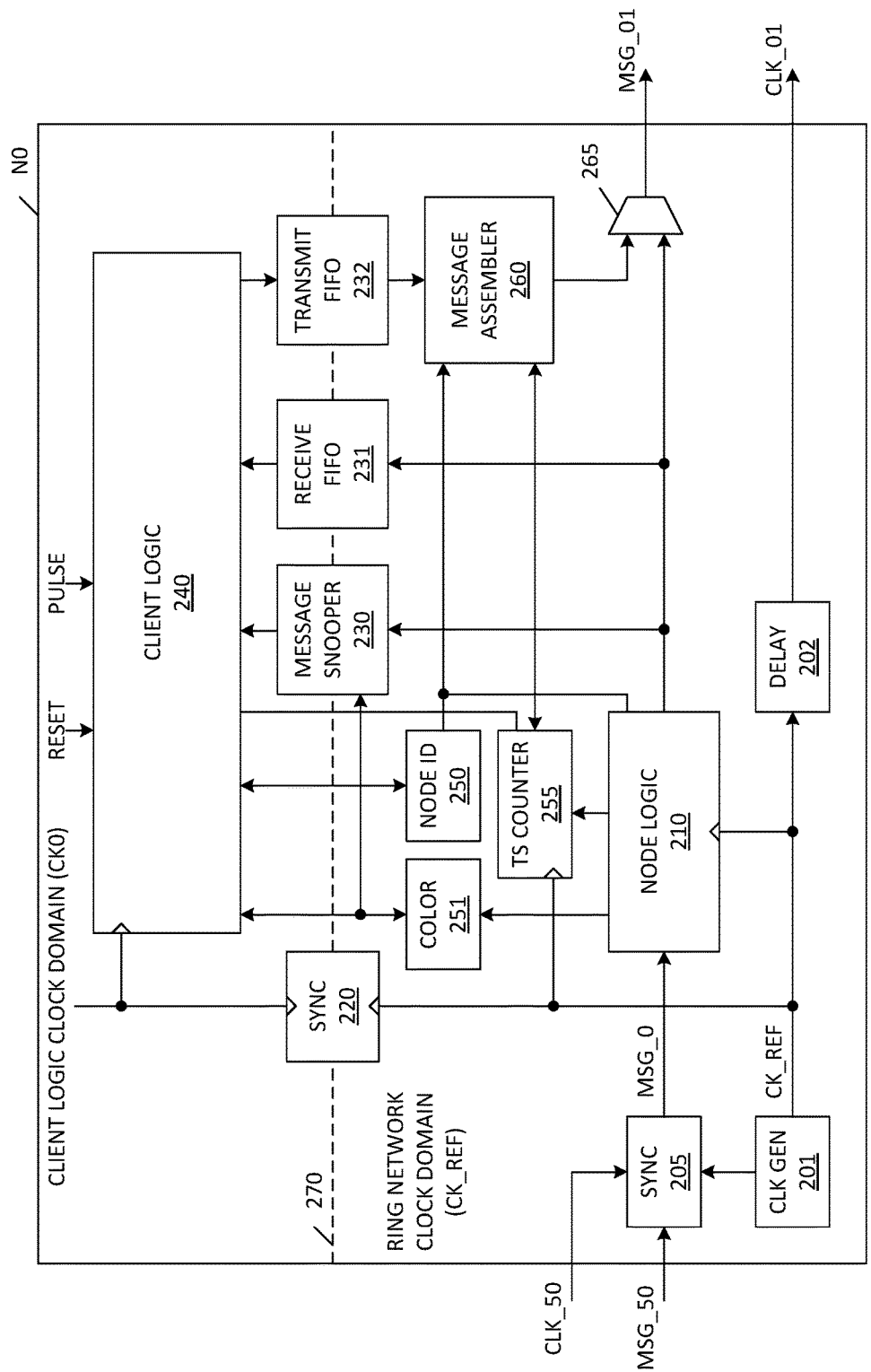
FIG. 2 is a block diagram of a root node of the distributed control synchronized ring network of FIG. 1 in accordance with one embodiment of the present invention.

FIG. 2 is a block diagram illustrating root node N0 in more detail in accordance with one embodiment of the present invention. Root node N0 includes master clock generator 201, delay line 202, resynchronizer 205, node logic 210, synchronizer 220, message snooper 230, receive first in first out (FIFO) memory 231, transmit FIFO memory 232, client logic 240, node identifier (ID) memory 250, color bit register 251, time stamp (TS) counter 255, message assembler 260 and multiplexer 265.

In general, root node N0 includes circuitry that operates in two clock domains, including a ring network clock domain (specified by reference clock CK_REF) and a client logic clock domain (specified by local clock signal CK0). The division between these clock domains is illustrated by dashed line 270 in FIG. 2. Thus, client logic 240 and transfers between client logic 240 and color bit register 251, node ID register 250, timestamp counter 255, message snooper 230, receive FIFO 231 and transmit FIFO 232 are performed in the client logic clock domain. Clock generator 201, delay line 202, resynchronizer 205, node logic 210, node identifier (ID) memory 250, color bit register 251, time stamp (TS) counter 255, message assembler 260 and multiplexer 265 operate in the ring network clock domain. In addition, write operations to message snooper 230 and receive FIFO 231 and read operations from transmit FIFO 232 are performed in the ring network clock domain. In accordance with one embodiment, synchronization circuit 220 (which receives the reference clock signal CK_REF and the local clock signal CK0) performs the synchronization between the ring network clock domain and the client logic clock domain using resynchronization methods known in the art. The requirements of the ring network clock domain and the client logic clock domain are described in more detail below.

Master clock generator 201 of root node N0 generates the reference clock signal CK_REF of the ring network 100. Conventional clock generation circuitry (e.g., a phase locked loop circuit) can be used to generate the reference clock signal CK_REF. In the described embodiments, the reference clock signal CK_REF has a frequency of about 5 GHz or more. However, it is understood that the reference clock signal CK_REF can have other frequencies in other embodiments. The frequency and voltage of the reference clock signal CK_REF can be scaled based on the bandwidth demands and power optimization of the ring network architecture. Note that a setup process (described below) can be performed at a lower reference clock frequency than normal operation, so that the wire delay between nodes N0-N5 has no impact on the setup process. Note that root node N0 is the only node that includes a master clock generator 201. As described in more detail below, each of the branch nodes N1, N2, N3, N4 and N5 operate in response to the corresponding clock signals CLK_01, CLK_12, CLK_23, CLK_34 and CLK_45 sent by their transmitting neighbors N0, N1, N2, N3 and N4. That is, the reference clock signal CK_REF is effectively transmitted through branch nodes N0-N5 in series.

Root node N0 uses the reference clock signal CK_REF to synchronize the incoming message MSG_50 (sent by transmitting neighbor N5 along with incoming clock signal CLK_50). More specifically, the incoming message MSG_50 was initially synchronized to the network clock domain of the transmitting neighbor N5. As a result, clock domain crossing synchronization is necessary within the root node N0 (i.e., the message MSG_50 received from the transmitting neighbor N5 must be resynchronized with the reference clock signal CK_REF within root node N0). In one embodiment, resynchronization circuit 205 performs this resynchronizing operation by latching the incoming message MSG_50 into a first flip-flop in response to the incoming clock signal CLK_50. The message MSG_50 provided at the output of the first flip-flop is then latched into a second flip flop in response to the reference clock signal CK_REF. The second flip-flop provides the synchronized message MSG_0, which is provided to node logic 210. This synchronized message MSG_0 is stored in node logic 210 in response to the reference clock signal CK_REF.

Figure 3:
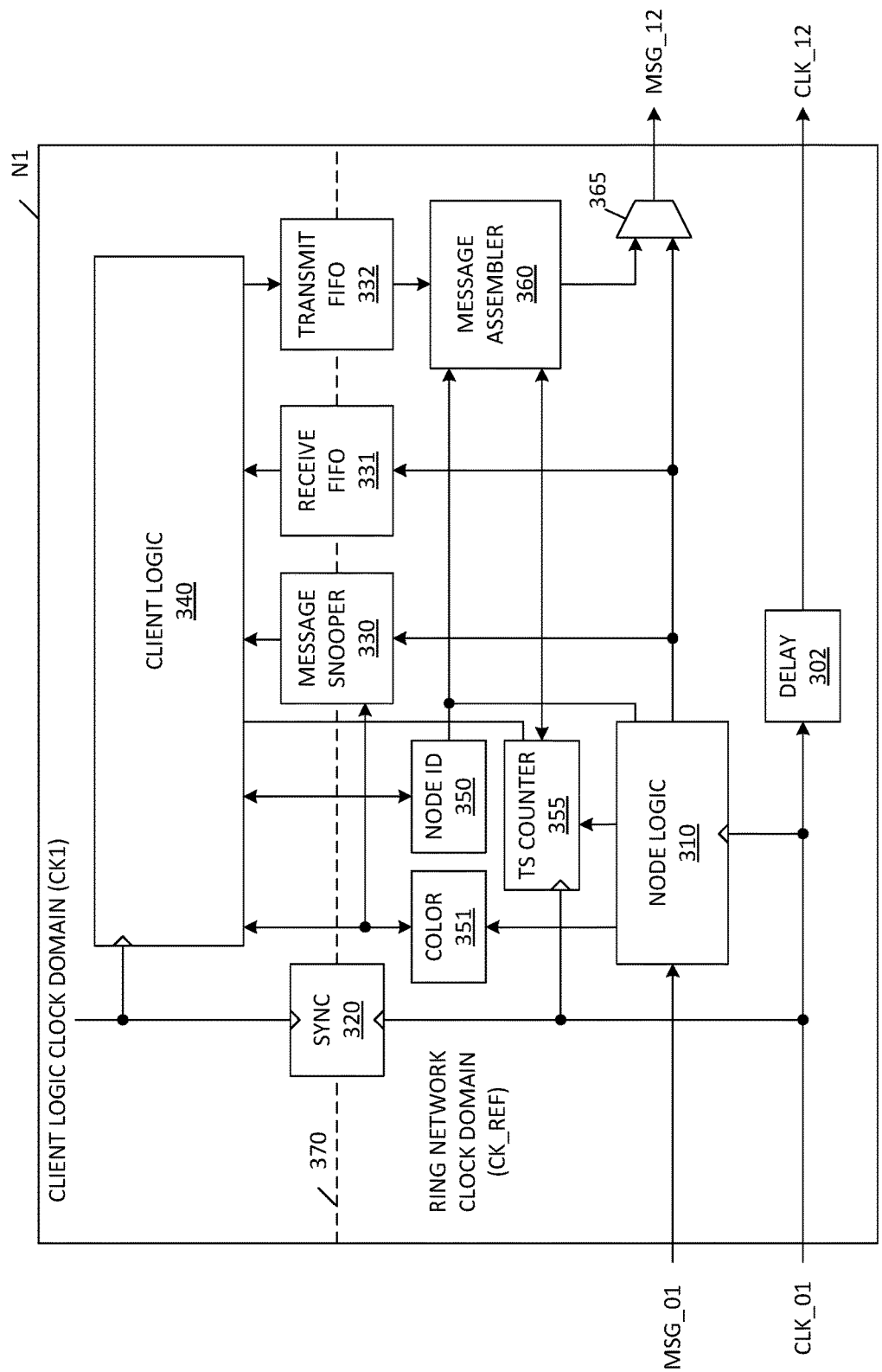
FIG. 3 is a block diagram of a branch node of the distributed control synchronized ring network of FIG. 1 in accordance with one embodiment of the present invention.

FIG. 3 is a block diagram illustrating branch node N1 in more detail. In the described embodiments, branch nodes N2-N5 are substantially identical to branch node N1 (although these nodes may implement different client logic). Branch node N1 includes clock delay line 302, node logic 310, synchronization circuit 320, message snooper 330, receive FIFO memory 331, transmit FIFO memory 332, client logic 340, node identifier (ID) memory 350, color bit register 351, time stamp (TS) counter 355, message assembler 360 and multiplexer 365. Note that the above-listed elements of branch node N1 are similar to the similarly named elements of root node N0. The client logic 340 of node N1 operates in response to a local node clock domain signal CK1. Dashed line 370 designates the boundary of the local clock domain (CK1) and the ring network clock domain (CK_REF), wherein synchronization circuit 320 provides for communications across these clock domains. Note that branch node N1 does not include circuits equivalent to the master clock generator 201 or the resynchronizer 205 of root node N0. That is, root node N0 includes the only master clock generator 201 of ring network 100.

The timing of the source synchronous transmission of messages and clock signals from root node N0 to branch node N1 will now be described. Note that transmission between other nodes is performed in the same manner as transmission from node N0 to node N1.

Figure 4:
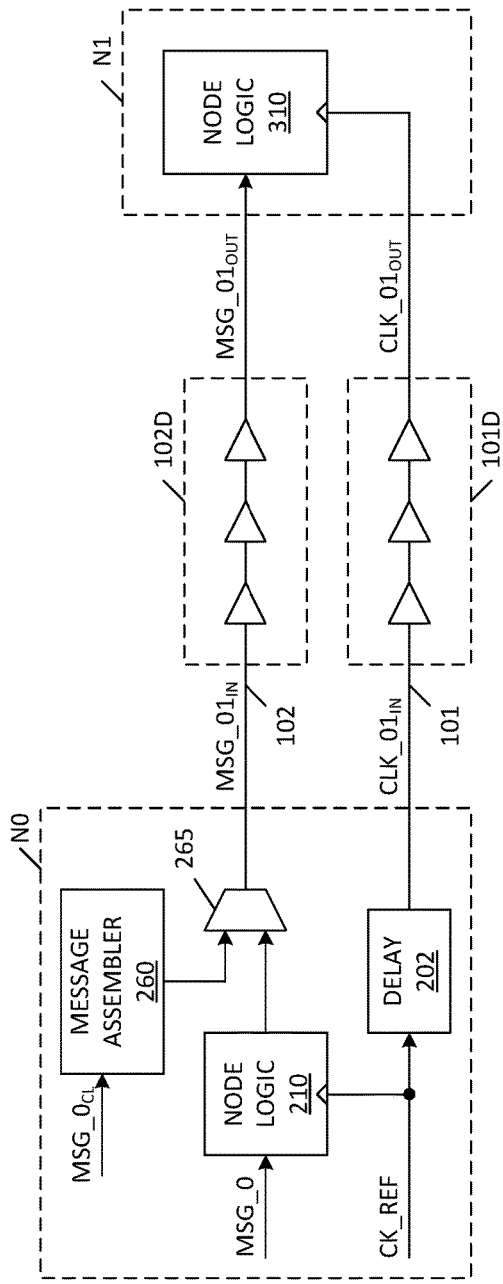
FIG. 4 is a block diagram illustrating portions of the root node of FIG. 2 and the branch node of FIG. 3 as used for the source synchronous transmission of messages with a clock signal in accordance with one embodiment of the present invention.
Figure 5:
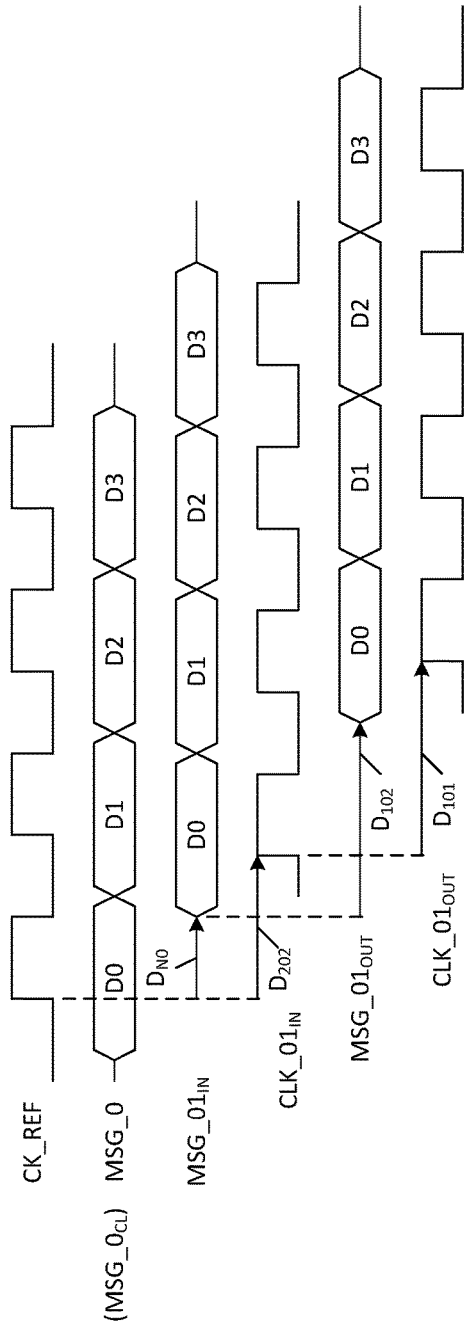
FIG. 5 is a waveform diagram illustrating the source synchronous timing of various signals of FIG. 4, in accordance with one embodiment of the present invention.

FIG. 4 is a block diagram illustrating relevant portions of nodes N0 and N1 for the transmission of messages and clock signals from node N0 to N1, including node logic 210, delay line 202, message assembler 260, multiplexer 265, ring network clock signal path 101, ring network message bus 102 and node logic 310. FIG. 5 is a waveform diagram illustrating the source synchronous timing of various signals of FIG. 4, in accordance with one embodiment of the present invention.

In general, node N0 can transmit output messages on two paths. In the first path, the message MSG_0 received by node logic 210 is forwarded to node logic N1. In this case, node logic 210 determines that the received message MSG_0 should be forwarded (e.g., determines that the received message MSG_0 does not address node N0), and forwards the message to multiplexer 265. Multiplexer 265 is controlled to route this message as the output message MSG_01 (which is designated as MSG_01$_{IN}$ in FIGS. 4 and 5). Node logic 210 and multiplexer 265 introduce a node delay D$_{N0}$ with respect to the reference clock signal CK_REF.

In the second path, a message MSG_0$_{CL}$ provided by client logic 240 is routed through transmit FIFO 232 and provided to message assembler 260 (in response to the reference clock signal CK_REF). Message assembler 260 provides required information (e.g., a timestamp value from a timestamp counter 250 and the node ID value from node ID memory 350) to the message MSG_0$_{CL}$, and provides the resulting message to multiplexer 265. Multiplexer 265 is controlled to route this message as the output message MSG_01 (which is designated as MSG_01$_{IN}$ in FIGS. 4 and 5). Message assembler 260 and multiplexer 265 introduce the node delay D$_{N0}$ to the message MSG_0$_{CL}$, with respect to the reference clock signal CK_REF. In one embodiment, message assembler 260 and node logic 210 are designed such that these circuits introduce the same (or a similar) delay to the received messages MSG_0$_{CL}$ and MSG_0, respectively, with respect to the reference clock signal CK_REF. FIG. 5 illustrates the node delay D$_{N0}$ that exists between the reference clock signal and the transmitted message MSG_01$_{IN}$ for either the message MSG_0 or the message MSG_0$_{CL}$.

Although the messages MSG_0 and MSG_0$_{CL}$ are described generically in the example of FIGS. 4 and 5, the details of these messages (and associated message 'types', including broadcast messages, read-modify-write messages, point-to-point unordered messages and point-to-point ordered messages) are described in more detail below.

Because the transmitted message MSG_01$_{IN}$ is delayed with respect to the reference clock signal CK_REF, delay line 202 is used to add a delay D$_{202}$ to the reference clock signal CK_REF, thereby creating the output clock signal CLK_01 of root node N0 (shown as clock signal CLK_01$_{IN}$ in FIGS. 4 and 5). The delay D$_{202}$ introduced by delay line 202 is selected to ensure that the clock signal CLK_01$_{IN}$ has a proper setup and hold time with respect to the message MSG_01$_{IN}$ transmitted from node N0. In one embodiment, the delay D$_{202}$ of delay line 202 is equalized to the node delay D$_{N0}$ described above. That is, the transmitted message MSG_01$_{IN}$ is synchronized to the output clock signal CLK_01$_{IN}$ using the known internal delays of the node N0. In accordance with one embodiment, the delay D$_{202}$ is adjustable (e.g., can be lengthened or shorted as desired under the control of node logic 210 and/or client logic 240).

Note that the structures 101D and 102D used to implement the clock signal path 101 and the message bus 102 between nodes N0 and N1 may exhibit significant delays (e.g., buffer delays). The delays introduced by clock signal line structure 101D and the message bus structure 102D are designated as delays D$_{101}$ and D$_{102}$, respectively. Thus, the clock signal CLK_01$_{OUT}$ received by node N1 is delayed by D$_{101}$ with respect to the clock signal CLK_01$_{IN}$ transmitted by node N0. Similarly, the message MSG_01$_{OUT}$ received by node N1 is delayed by D$_{102}$ with respect to the message MSG_01$_{IN}$ transmitted by node N0. This relationship is shown in FIG. 5. In order to maintain the desired setup and hold times established by node N0 (when generating CLK_01$_{IN}$ and MSG_01$_{IN}$), the delays D$_{101}$ and D$_{102}$ must be the same. It is therefore very important that the wires and buffers used to implement the clock signal line structure 101D and the message bus structure 102D are highly equalized and balanced in order to minimize setup and hold time loss. That is, the clock path structure 101D and message bus structure 102D should provide substantially identical transmission characteristics between nodes N0 and N1, such that the relative phases of the transmitted clock signal CLK_01$_{IN}$ and the transmitted message MSG_01$_{IN}$ are maintained at the receiving node N1 by received clock signal CLK_01$_{OUT}$ and received message MSG_01$_{OUT}$.

In accordance with the above-described example, the clock path 101 and the message bus 102 operate as a wave pipeline system, wherein messages transmitted on the message bus 102 are latched into the receiving node in a source-synchronous manner using the clock signal transmitted on the clock path 101. In this manner, messages are transmitted from node N0 to node N1 at the frequency of the reference clock signal CK_REF, allowing for fast data transfer from node N0 to node N1. During normal operation, the node logic within each of the nodes N0-N5 latches incoming messages in response to the received clock signal (e.g., node logic 210 and 310 latch the incoming messages MSG_0 and MSG_01, respectively, in response to the received clock signals CK_REF and CLK_01, respectively).

Because wave pipelining is implemented, the wire and buffer delays D$_{101}$ and D$_{102}$ of the clock signal line structure 101D and the message bus structure 102D will not degrade the operating frequency of the ring network 100. Note that the wave pipelining may allow a transmitting node to send a first message to a receiving node, and then send a second message to the receiving node, before the receiving node has received the first message. That is, there may be a plurality of messages simultaneously propagating from node N0 to node N1 on the message bus structure 102D. Note that this may occur if the period of the reference clock signal CK_REF (e.g., 200 ps for a 5 GHz clock) is less than the wire/buffer delay $D_{101}/D_{102}$ between the adjacent nodes N0 and N1. In accordance with one embodiment, the wire/buffer delay $D_{101}/D_{102}$ between each pair of adjacent nodes must be long enough (i.e., exhibit a minimum delay) to ensure that a first plurality of messages being transmitted from a first node (e.g., node N0) to an adjacent second node (e.g., node N1) do not overtake a second plurality of messages being transmitted from the second node (e.g., node N1) to an adjacent third node (e.g., node N2).

In one embodiment, the gate delay of the node logic 210 and multiplexer 265 may determine the maximum frequency of the reference clock signal CK_REF. For maximum efficiency, the period of the generated reference clock signal CK_REF should be equalized to the node delay $D_{N0}$. In one embodiment, the node logic 210 includes sequential logic (e.g., 10 levels of fan out 4 (FO4) logic), which allows the reference clock signal CK_REF to have a frequency of 5 GHz or greater.

Because the node logic 210 has a relatively simple design, communications between the nodes N0-N5 of the ring network can be performed at a relatively high frequency. Client logic 240 typically includes a more complicated design, and may operate at a slower frequency than the frequency of the reference clock signal CK_REF. That is, while client logic 240 may receive messages from the ring network at the frequency of the reference clock signal CK_REF, the client logic 240 is not required to respond at the frequency of the reference clock signal CK_REF.

In an alternate embodiment, the ring network 100 can also be operated in response to a reference clock signal CK_REF having a relatively low frequency, wherein the period of the reference clock signal CK_REF is greater than the wire/buffer delay $D_{101}/D_{102}$ between adjacent nodes. In this case, each message transmitted by a node is received (and latched) by the adjacent node before the transmitting node sends the next message. In this embodiment, the wire/buffer delay $D_{101}/D_{102}$ between adjacent nodes has no impact on the signal pipeline. In one embodiment, the reference clock signal CK_REF is reduced to such a low frequency during a setup phase (described below), but is increased to a high frequency (e.g., 5 GHz or more) during normal operation.

The set-up of the nodes N0-N5 of ring network 100 will now be described.

Figure 6:
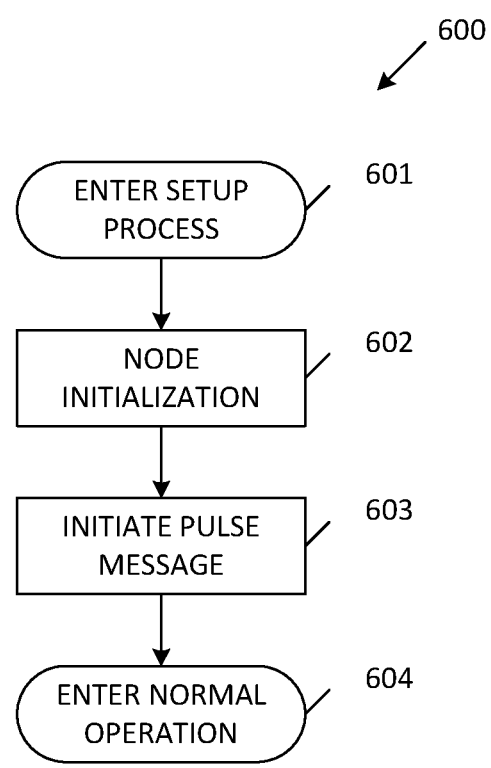
FIG. 6 is flow diagram illustrating a method of initializing the ring network of FIG. 1 in accordance with one embodiment of the present invention.

FIG. 6 is a flow diagram 600 illustrating a method of initializing ring network 100 in accordance with one embodiment of the present invention. As illustrated by step 601 of FIG. 6, a setup process is started (e.g., by activating the RESET signal provided to client logic 240 of root node N0). In response, client logic 240 starts a node initialization process (Step 602), wherein the node ID values stored in the node ID registers of nodes N0-N5 are initialized, the color bits stored in the color bit registers of nodes N0-N5 are reset to a predetermined value (e.g., '0'), and the time stamp values stored by the time stamp counters within each of the nodes N0-N5 are reset to a predetermined value (e.g., '0'). As illustrated by step 603 of FIG. 6, a pulse message, which cycles through each of the nodes N0-N5, is initiated (e.g., by activating the PULSE signal provided to client logic 240 of root node N0). Normal operation of the ring network 100 then begins (Step 604).

Figure 7:
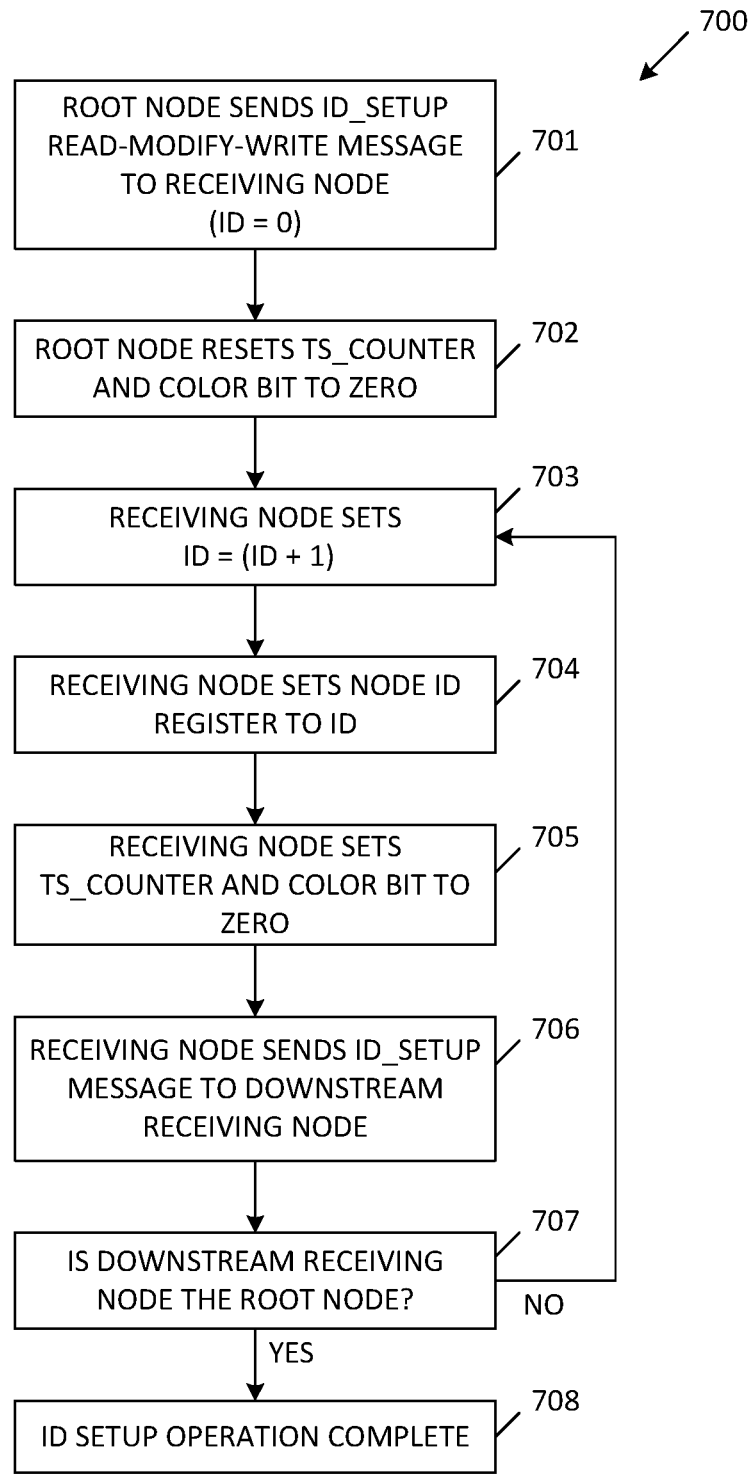
FIG. 7 is flow diagram illustrating a method of implementing a node initialization process the method of FIG. 6 in accordance with one embodiment of the present invention.

FIG. 7 is a flow diagram 700 illustrating a method of implementing the node initialization process of step 602 in accordance with one embodiment of the present invention. Root node N0 is hardwired such that node ID register 250 stores a node ID value equal to '0'. In response to receiving the activated RESET signal, client logic 240 generates an ID_setup message, which is a read-modify-write message (step 701). This ID_setup message includes an node ID field, which is initially set to have a value of '0' (based on the node ID value stored by node ID register 250 of node N0). Client logic 240 also resets its timestamp counter 255 to store a timestamp value of '0', and also resets its color bit register 251 to store a color bit value of '0' (Step 702). Client logic 240 transmits the ID_setup message to adjacent receiving node N1 (via transmit FIFO 232, message assembler 260 and multiplexer 265). This ID_setup message is synchronized with the reference clock signal CK_REF in the manner described above in connection with FIGS. 4 and 5.

Node logic 310 receives the ID_setup message (using the corresponding clock signal CLK_01) within node N1. Node logic 310 sends the ID_setup message to the client logic 340 within node N1 (via receive FIFO 331). In response, client logic 340 increments the ID value in the ID field of the ID_setup message by one (Step 703). Client logic 340 then writes the updated ID value (e.g., '1') to its node ID register 350 (step 704). Client logic 340 also resets its timestamp counter 355 to store a timestamp value of '0', and also resets its color bit register 351 to store a color bit value of '0' (Step 705). Thus, branch node N1 is assigned an node ID value equal to '1', a timestamp value equal to '0' and a color bit value equal to '0'.

The client logic 340 transmits the modified ID_setup message, which includes the updated node ID value, to the adjacent receiving node N2 (via transmit FIFO 332, message assembler 360 and multiplexer 365) (Step 706).

If the downstream receiving node is the root node N0 (step 707, YES branch), then the ID_setup operation is complete (step 708). If the downstream receiving node is not the root node N0 (step 707, NO branch), then processing returns to step 703, whereby the client logic in the receiving branch node increments the node ID value in the ID_setup message by one (step 703), stores the incremented node ID value in its node ID register (step 704), and resets its timestamp counter and color bit (step 705). This process continues such that nodes N0 to N5 are assigned unique node ID values of 0 to 5, respectively. At the end of the ID_setup operation, the timestamp counters of nodes N0-N5 all store the same timestamp value (e.g., '0') and the same color bit value (e.g., '0').

After the node initialization process is complete, the client logic 240 in node N0 transmits a pulse message on ring network 100. In one embodiment, the pulse message is initiated by an activated PULSE signal provided to client logic 240). In an alternate embodiment, client logic 240 initiates the pulse message in response to receiving the modified ID_setup message from transmitting node N5. The pulse message continuously traverses the ring network 100. The pulse message is sequentially provided to the node logic within nodes N0-N5. Each time that the node logic within a node receives the pulse message, the node logic toggles the color bit value stored in its corresponding color bit register. For example, the first time that node logic 310 in node N1 receives the pulse message from node N0, the node logic 310 changes the value of the color bit stored in color bit register 351 from '0' to '1'. As described in more detail below, the color bits are used in the arbitration of ordered messages received by the nodes N0-N5.

After completing the above-described setup process, nodes N0-N5 are ready for normal operation. Normal operation of ring network 100 in accordance with one embodiment of the present invention will now be described.

The client logic (e.g., client logic 240) of nodes N0-N5 communicate by exchanging messages through the message bus 102. The width and the format of the message bus 102 must satisfy the following requirements. Message bus 102 must be able to encapsulate all of the message types described in more detail below. Message bus 102 is also designed to provide the required bandwidth and timing, while minimizing the required layout area of the wires/buffers.

In one embodiment, four message types are implemented on message bus 102, including: 1) broadcast messages, 2) read-modify-write messages, 3) point-to-point unordered messages and 4) point-to-point ordered messages. Most of these messages are generated by the client logic within the nodes N0-N5, which may include, for example, a central processing unit (CPU) or a memory controller.

In a broadcast message, the client logic of the transmitting node (e.g., client logic 240 of node N0) sends the broadcast message to its receiving neighbor (e.g., node N1, via transmit FIFO 232, message assembler 260 and multiplexer 265). The node logic within the receiving neighbor (e.g., node logic 310) receives the broadcast message. In response, this node logic routes the broadcast message to its corresponding client logic (e.g., client logic 340, via its corresponding receive FIFO 331). This node logic also forwards the broadcast message to its receiving neighbor (e.g., node N2, via multiplexer 365.) The forwarding is stopped when the original transmitting node (e.g., node N0) receives the broadcast message from its transmitting neighbor (e.g., node N5). For example, a cache line invalidation request may be transmitted as a broadcast message.

In a read-modify-write message, the client logic of the transmitting node (e.g., client logic 240 of node N0) sends a message to its receiving neighbor (e.g., node N1, via transmit FIFO 232, message assembler 260 and multiplexer 265). The node logic within the receiving neighbor (e.g., node logic 310) receives the read-modify-write message, and forwards this message to its corresponding client logic (e.g., client logic 340, via its corresponding receive FIFO 331). This client logic may modify the message, if necessary. The client logic subsequently forwards the read-modify-write message to its receiving neighbor (e.g., node N2, via transmit FIFO 332, message assembler 360 and multiplexer 365). Note that the client logic will forward the read-modify-write message at its own discretion (e.g., using corresponding flow control and bandwidth allocation logic), which may be some number of cycles (of the local clock signal) after receiving the read-modify-write message. This forwarding process is repeated by each of the nodes, until the read-modify-write message is returned to the original transmitting node (e.g., node N0) by its transmitting neighbor (e.g., node N5). The original transmitting node processes the received read-modify-write, and stops the propagation of the read-modify-write message. The ID_setup message described above in connection with the setup process is an example of a read-modify-write message. In accordance with another example, a cache-line snoop response from a CPU may be transmitted as a read-modify-write message.

In a point-to-point unordered message, the client logic of the transmitting node (e.g., client logic 240 of node N0) sends a message to its receiving neighbor (e.g., node N1, via transmit FIFO 232, message assembler 260 and multiplexer 265). The point-to-point unordered message addresses a particular one of the other nodes (e.g., node N2), wherein the node ID value of the addressed node is included in the message. The node logic within each intermediate node between the transmitting node and the addressed node forwards the message to its receiving neighbor, until the message reaches the addressed node. For example, the node logic 310 in node N1 may receive a point-to-point unordered message from node NO, compare its node ID value (e.g., '1') with the node ID value included in the message (e.g., '2'), and in response, determine that the message does not address node N1. In response, node logic 310 forwards the point-to-point unordered message to receiving node N2 (via multiplexer 365). Note that the node logic 310 does not forward the message to the client logic 340 within the non-addressed node N1. Upon receiving the point-to-point unordered message, the node logic within node N2 would then determine that the node ID value included in the point-to-point unordered message (e.g., '2') is equal to its own node ID value (e.g., '2'), and in response, provide the point-to-point unordered message to its corresponding client logic (via its corresponding receive FIFO). The point-to-point unordered message is not transmitted beyond the addressed node on the ring network 100 (e.g., node N2 does not forward the point-to-point unordered message to node N3). In one embodiment, a data response to a read request may be transmitted as a point-to-point unordered message.

In a point-to-point ordered message, the client logic of the transmitting node (e.g., client logic 240 of node NO) sends a message to its receiving neighbor (e.g., node N1, via transmit FIFO 232, message assembler 260 and multiplexer 265). The point-to-point ordered message addresses a particular one of the other nodes (e.g., node N2), wherein the node ID value of the addressed node is included in the message. The transmitting node also attaches its own unique node ID value from its own node ID register (e.g., node ID value '0' from node ID register 250) and a current time stamp value (TS) from its own time stamp counter (e.g., time stamp counter 255) to the message. Within the transmitting node (e.g. node N0), the message assembler 260 increments the time stamp counter 255 upon transmitting the point-to-point ordered message.

The node logic within each intermediate node (e.g., node N1) between the transmitting node and the addressed node compares its node ID value (e.g., '1') with the addressed node ID value included in the point-to-point ordered message (e.g., '2'), and in response, determines that the message does not address this intermediate node. In response, the node logic 310 of this intermediate node N1 forwards the point-to-point ordered message to its corresponding receiving node N2 (via multiplexer 365). Upon receiving the point-to-point ordered message, the node logic in each node increments its corresponding timestamp counter, and stores the ordered message in its message snooper (e.g., within node N1, node logic 310 increments its timestamp counter 355 and stores the ordered message in its message snooper 330).

Upon receiving the point-to-point ordered message, the node logic within the addressed node (e.g., node N2) increments its timestamp counter, and determines that the addressed node ID value included in the point-to-point ordered message is equal to its own node ID value (e.g., '2'). In response, the node logic within the addressed node N2 causes the color bit value stored in its color bit register to be stored in its message snooper, along with the point-to-point ordered message. The node logic within the addressed node N2 then forwards the ordered message to its corresponding receiving node (e.g., node N3). This forwarding continues until the ordered message reaches the original transmitting node (e.g., node N0), wherein each intermediate node increments its timestamp counter and captures the ordered message into its message snooper. Upon receiving the ordered message, the original transmitting node (e.g., node N0) does not increment its timestamp counter. At this time, the original transmitting node can determine whether its ordered message will be awarded priority by the addressed node by examining the contents of its own message snooper. The addressed node waits until the pulse message changes the state of the color bit stored in its corresponding color bit register to resolve the priority of the point-to-point ordered message. In this manner, the information in the message snooper in each node provides a consistent view of the order in which messages are issued, even though messages are received by each node in different orders. The information in the message snoopers will be used for arbitration and conflict resolution in a manner described in more detail below.

As described above, each of the nodes N0-N5 temporarily stores each of the received point-to-point ordered messages into its message snooper (e.g., message snoopers 230 and 330 of nodes N0 and N1 store the ordered messages received by node logic 210 and 310, respectively). In the described embodiments, each of the message snoopers is a FIFO, wherein the depth of the message snooper FIFO is a design parameter of the ring network 100. In one embodiment, the depth of each message snooper is selected to provide an appropriate tradeoff in layout area, operating speed, power consumption and required bandwidth. As described below, the depth of the message snooper limits the number of point-to-point ordered message requests that can be outstanding on the ring network 100 at any given time.

In accordance with one embodiment, each node of the ring network 100 is assigned a quota of point-to-point ordered message requests, wherein this quota ranges from 0 to a value equal to the depth of the message snooper minus one. Each node cannot have a number of outstanding point-to-point ordered messages exceeding its quota, wherein a point-to-point ordered message is considered outstanding until it has looped back to its originating node. The quota assigned to each node does not need to be the same. For example, the quota of a node not capable of sending out point-to-point ordered messages can be set to zero, while a performance critical node (e.g., a CPU) can be assigned a larger quota of point-to-point ordered messages. However, the total number of possible outstanding point-to-point ordered message requests (e.g., the sum of the quotas assigned to each of the nodes N0-N5) must be less than the depth of the message snooper.

Each message snooper captures the point-to-point ordered messages passing through the corresponding node. As described in more detail below, these captured ordered messages are used to identify the order in which the messages were issued on the ring network 100.

As described above, each of the timestamp counters in nodes N0-N5 is initialized to a value of '0', and each is incremented when the corresponding node transmits an original point-to-point ordered message, or receives a point-to-point ordered message that originated in another node. Each of the timestamp counters counts up to a MAX COUNT value. After reaching the MAX COUNT value, the timestamp counters wrap around to a value of '0'. In one embodiment, the MAX COUNT value is selected to be at least two times the number of entries of each message snooper to avoid counter aliasing.

In one embodiment, initializing (or wrapping around) the timestamp counter also inverts a sign bit of the timestamp counter value. As described in more detail below, the nodes N0-N5 use the timestamp value (and the sign bit) to determine the order of point-to-point ordered messages received on the message bus 102.

In general, if the sign bits of the timestamp values associated with two point-to-point ordered messages are equal, then the point-to-point ordered message with a lower timestamp value is older (and therefore has priority). If the sign bits of the timestamp values associated with two point-to-point ordered messages are different, then the point-to-point ordered message with a higher timestamp value is older (and therefore has priority). If the sign bits and timestamp values associated with two point-to-point ordered messages are equal, then the two point-to-point ordered messages were sent at the same time. Under these conditions, a 'tie-breaker' is necessary to provide a resolution. For example, an address hashing function may be applied to each point-to-point ordered message to generate a random value. The point-to-point ordered message associated with the larger value may be designated as the older message and awarded priority. Other methods can also be used to provide a priority resolution under these conditions.

The manner in which the priority of point-to-point ordered messages is determined in accordance with one embodiment of the present invention will now be described in more detail, using a specific example. In this example, the client logic 240 of root node N0 includes a first CPU (e.g., CPU_0), the client logic of branch node N3 includes a second CPU (e.g., CPU_1), and the client logic of branch node N5 includes a system memory. Both CPU_0 (node N0) and CPU_1 (node N3) attempt an exclusive access to the same cache line 'A' in the system memory of node N5. In the described example, it is assumed that the timestamp counter of each of the nodes N0-N5 initially has a value of '0'.

Figure 8A:

FIG. 8A is a table 800 that illustrates the status of the ring network 100 at time T0, including: the actions performed by nodes N0-N5, the output messages provided on the message bus 102 by nodes N0-N5, and the contents of the message snoopers of nodes N0-N5, the values of the timestamp counters of nodes N0-N5, the values of the color bits of nodes N0-N5, and the location of the pulse message that continuously travels around the ring network 100. At time T0, the CPU_0 of root node N0 transmits a message M*0_5(0) on the message bus 102 (e.g., as MSG_01). In the examples described herein, a message bus notation of M*X_Y(Z) is used, wherein M* specifies a point-to-point ordered message, X specifies the source node ID (i.e., the contents of the node ID register 250 of the node N0 that originates the message), Y corresponds with the destination node ID (i.e., the contents of the node ID register of the node N5 to receive the point-to-point ordered message), and Z corresponds with the timestamp value of the originating node N0 (at the time the message is initially sent). Thus, message M*0_5(0) specifies a point-to-point ordered message transmitted from node N0 to node N5, initiated when the timestamp counter of node N0 has a value of 0. In the described example, message M*0_5(0) includes additional information (not shown) that indicates that the transaction is an access to a cache line 'A' in the system memory of node N5. Upon transmitting the point-to-point ordered message M*0_5(0) on the message bus 102, the CPU_0 of node N0 increments its timestamp counter 255 from a value of 0 to a value of 1. The message snooper 230 of node N0 stores the message M*0_5(0).

Also at time T0, the node N2 transmits an ordered point-to-point message M*2_4(0) on the message bus 102 (e.g., as MSG_23). In accordance with the nomenclature defined above, message M*2_4(0) specifies a point-to-point ordered message transmitted from node N2 to node N4, initiated when the timestamp counter of node N2 has a value of 0. Upon transmitting the point-to-point ordered message M*2_4(0) on the message bus 102, the node N2 increments its timestamp counter from a value of 0 to a value of 1. The message snooper of node N2 stores the message M*2_4(0).

Note that at time T0, nodes N1 and N3-N5 do not initiate any actions (or provide any messages on the message bus 102) and the message snoopers of nodes N1 and N3-N5 are empty. Because none of these nodes N1 and N3-N5 has received or transmitted a point-to-point ordered message, the timestamp counters of these nodes remain unchanged.

In the illustrated example, the pulse message reaches node N4 at time T0, thereby causing the color bit of node N4 to transition from a '0' value to a '1' value. Note that the color bit values and the pulse location are arbitrarily selected for the present example.

FIG. 8B is a table 801 that illustrates the status of the ring network 100 during the next cycle T1. At this time, none of the nodes N0-N5 transmit any new messages. The message M*0_5(0) is received by node N1, and this node N1 stores the message M*0_5(0) in its message snooper. Because node N1 has received a point-to-point ordered message, node N1 increments its timestamp counter from 0 to 1. The node logic 310 within node N1 then transmits the point-to-point ordered message M*0_5(0) to node N2.

In addition, the point-to-point ordered message M*2_4(0) is received by node N3, and this node N3 stores the message M*2_4(0) in its message snooper. Because node N3 has received a point-to-point ordered message, node N3 increments its timestamp counter from 0 to 1. The node logic within node N3 then transmits the point-to-point ordered message M*2_4(0) to node N4.

The pulse message reaches node N5 during cycle T1, thereby causing the color bit of node N5 to toggle from a '0' value to a '1' value.

FIG. 8C is a table 802 that illustrates the status of the ring network 100 during the next cycle T2. During this cycle T2, the CPU_1 of node N3 transmits a message M*3_5(1) on the message bus 102 (e.g., as MSG_34) and stores this message M*3_5(1) in its message snooper. As described above, message M*3_5(1) specifies a point-to-point ordered message from node N3 to node N5. Note that the timestamp value of node N3 is '1' at the time the message M*3_5(1) is generated. In the described example, message M*3_5(1) includes additional information (not shown) that indicates that the transaction is an access to a cache line 'A' in the system memory of node N5. Because node N3 has transmitted an ordered message M*3_5(1), the timestamp counter of node N3 is incremented, from 1 to 2. Note that nodes N0-N2 and N4-N5 do not initiate any new actions during cycle T2.

Also during cycle T2, the point-to-point ordered message M*0_5(0) is received by node N2, and this node N2 stores the message M*0_5(0) in its message snooper. Because node N2 has received an ordered message, node N2 increments its timestamp counter from 1 to 2. The node logic within node N2 then transmits the point-to-point ordered message M*0_5(0) to node N3.

In addition, the point-to-point ordered message M*2_4(0) is received by node N4, and this node N4 stores the message M*2_4(0) in its message snooper. Because node N4 has received an ordered message, node N4 increments its timestamp counter from 0 to 1. The node logic within node N4 then transmits the point-to-point ordered message M*2_4(0) to node N5.

The pulse message reaches node N0 during cycle T2, thereby causing the color bit of node N0 to toggle from a '1' value to a '0' value.

FIG. 8D is a table 803 that illustrates the status of the ring network 100 during the next cycle T3. At this time, none of the nodes N0-N5 transmit any new messages. The point-to-point ordered message M*0_5(0) is received by node N3, and this node N3 stores the message M*0_5(0) in its message snooper. Because node N3 has received an ordered message, node N3 increments its timestamp counter from 2 to 3. Node logic within node N3 then transmits the point-to-point ordered message M*0_5(0) to node N4.

In addition, the point-to-point ordered message M*2_4(0) is received by node N5, and this node N5 stores the message M*2_4(0) in its message snooper. Because node N5 has received an ordered message, node N5 increments its timestamp counter from 0 to 1. The node logic within node N5 then transmits the point-to-point ordered message M*2_4(0) to node N0.

In addition, the point-to-point ordered message M*3_5(1) is received by node N4, and this node N4 stores the message M*3_5(1) in its message snooper. Because node N4 has received an ordered message, node N4 increments its timestamp counter from 1 to 2. Node logic within node N4 then transmits the point-to-point ordered message M*3_5(1) to node N5.

The pulse message reaches node N1 during cycle T3, thereby causing the color bit of node N1 to toggle from a '1' value to a '0' value.

FIG. 8E is a table 804 that illustrates the status of the ring network 100 during the next cycle T4. At this time, none of the nodes N0-N5 transmit any new messages. The point-to-point ordered message M*0_5(0) is received by node N4, and this node N4 stores the message M*0_5(0) in its message snooper. Because node N4 has received an ordered message, node N4 increments its timestamp counter from 2 to 3. The node logic within node N4 then transmits the point-to-point ordered message M*0_5(0) to node N5.

In addition, the point-to-point ordered message M*2_4(0) is received by node N0, and this node N0 stores the message M*2_4(0) in its message snooper. Because node N0 has received an ordered message, node N0 increments its timestamp counter from 1 to 2. The node logic within node N0 then transmits the point-to-point ordered message M*2_4(0) to node N1.

In addition, the point-to-point ordered message M*3_5(1) is received by node N5, and this node N5 stores the message M*3_5(1) in its message snooper. Because node N5 has received an ordered message, node N5 increments its timestamp counter from 1 to 2. Because the point-to-point ordered message M*3_5(1) addresses node N5, node N5 determines and stores the state of the color bit (e.g., color bit=1) at the time the message M*3_5(1) is received. In one embodiment, this color bit is stored along with the point-to-point ordered message M*3_5(1) in the message snooper of node N5. To ensure that node N5 resolves point-to-point ordered messages in the proper order, node N5 must wait to resolve the received point-to-point ordered message M*3_5(1) until the value of the color bit is toggled (e.g., the color bit transitions to a value of 0 within node N5). The node logic of node N5 then transmits the point-to-point ordered message M*3_5(1) to node N0.

The pulse message reaches node N2 during cycle T4, thereby causing the color bit of node N2 to toggle from a '1' value to a '0' value.

FIG. 8F is a table 805 that illustrates the status of the ring network 100 during the next cycle T5. At this time, none of the nodes N0-N5 transmit any new messages. The point-to-point ordered message M*0_5(0) is received by node N5, and this node N5 stores the message M*0_5(0) in its message snooper. Because node N5 has received an ordered message, node N5 increments its timestamp counter from 2 to 3. Because the point-to-point ordered message M*0_5(0) addresses node N5, node N5 determines and stores the state of the color bit (e.g., color bit=1) at the time the message M*0_5(0) is received. To ensure that node N5 resolves ordered messages in the proper order, node N5 must wait to resolve the received point-to-point ordered message M*0_5(0) until the value of the color bit is toggled (e.g., the color bit transitions to a value of 0 within node N5). The node logic of node N5 then transmits the point-to-point ordered message M*0_5(0) to node N0.

In addition, the point-to-point ordered message M*2_4(0) is received by node N1, and this node N1 stores the message M*2_4(0) in its message snooper. Because node N1 has received an ordered message, node N1 increments its timestamp counter from 1 to 2. The node logic of node N1 then transmits the message M*2_4(0) to node N2.

In addition, the point-to-point ordered message M*3_5(1) is received by node N0, and this node N0 stores the message M*3_5(1) in its message snooper. Because node N0 has received an ordered message, node N0 increments its timestamp counter from 2 to 3. The node logic of node N0 then transmits the point-to-point ordered message M*3_5(1) to node N1.

The pulse message reaches node N3 during cycle T5, thereby causing the color bit of node N3 to toggle from a '1' value to a '0' value.

FIG. 8G is a table 806 that illustrates the status of the ring network 100 during the next cycle T6. At this time, none of the nodes N0-N5 transmit any new messages. The point-to-point ordered message M*0_5(0) loops back to the originating node N0. In response, node N0 stops the propagation of this message M*0_5(0) on ring network 200. Note that node N0 does not increment its timestamp counter in response to receiving the ordered message that it originally transmitted. Upon receiving the message M*0_5(0), node N0 accesses its message snooper, and compares the stored ordered messages to determine that its point-to-point ordered message M*0_5(0) has priority over the other point-to-point ordered message M*3_5(1) that addressed the same node N5 (because the message M*0_5(0) has a lower timestamp than the other ordered message M*3_5(1)). As a result, node N0 is informed that its point-to-point ordered message M*0_5(0) will be awarded priority by node N5, and will be processed by node N5.

In addition, the point-to-point ordered message M*2_4(0) loops back to the originating node N2. In response, node N2 stops the propagation of this message M*2_4(0) on ring network 200. Node N2 does not increment its timestamp counter in response to receiving the ordered message that it originally transmitted. Upon receiving the message M*2_4(0), node N2 accesses its message snooper, and compares the stored ordered messages to determine that its message M*2_4(0) has priority over the other ordered messages stored in its message snooper (because none of these other messages addresses node N4). As a result, node N2 is informed that its message M*2_4(0) will be awarded priority by node N4, and will be processed by node N4.

In addition, the point-to-point ordered message M*3_5(1) is received by node N1, and this node N1 stores the message M*3_5(1) in its message snooper. Because node N1 has received an ordered message, node N1 increments its timestamp counter from 2 to 3. The node logic of node N1 then transmits the point-to-point ordered message M*3_5(1) to node N2.

The pulse message reaches node N4 during cycle T6, thereby causing the color bit of node N4 to toggle from a '1' value to a '0' value. Note that node N4 resolves the priority of the ordered messages stored in its message snooper in response to the toggling of its color bit. As described above, node N4 awards priority to the only ordered message M*2_4(0) in its message buffer that addressed node N4.

FIG. 8H is a table 807 that illustrates the status of the ring network 100 during the next cycle T7. At this time, none of the nodes N0-N5 transmit any new messages. The pulse message reaches node N5 during cycle T7, thereby causing the color bit of node N5 to toggle from a '1' value to a '0' value. In response to the toggling of this color bit, node N5 performs arbitration of the ordered messages stored in its message snooper while the color bit had the previous value of '1'. Thus, node N5 determines that point-to-point ordered message M*0_5(0) has priority over other point-to-point ordered message M*3_5(1), because the message M*0_5(0) has a lower timestamp value than the other message M*3_5(1). In response, node N5 will access the data requested by message M*0_5(0) in cache line 'A' of the system memory. Note that node N5 will generate a separate message (not shown) transmitting this requested data to node N0. Further note that node N5 ignores the point-to-point ordered message M*2_4(0) stored in its message snooper, because this message does not address node N5.

In addition, the point-to-point ordered message M*3_5(1) is received by node N2, and this node N2 stores the message M*3_5(1) in its message snooper. Because node N2 has received an ordered message, node N2 increments its timestamp counter from 2 to 3. The node logic of node N2 then transmits the point-to-point ordered message M*3_5(1) to node N3.

FIG. 8I is a table 808 that illustrates the status of the ring network 100 during the next cycle T8. At this time, none of the nodes N0-N5 transmit any new messages. The point-to-point ordered message M*3_5(1) loops back to the originating node N3. In response, node N3 stops the propagation of this message M*3_5(1) on ring network 200. Node N3 does not increment its timestamp counter in response to receiving the point-to-point ordered message that it originally transmitted. Upon receiving the message M*3_5(1), node N3 accesses its message snooper, and compares the stored ordered messages to determine that the point-to-point ordered message M*0_5(0) transmitted by node N0 has priority over its own point-to-point ordered message M*3_5(1) (because message M*0_5(0) has a lower timestamp value than message M*3_5(1)). As a result, node N3 is informed that its message M*3_5(1) will not be awarded priority by node N5, and will be not be processed by node N5. In response, node N3 may determine that the message M*3_5(1) should be retransmitted.

In the foregoing manner, point-to-point ordered messages can be processed by ring network 100 without requiring a complex centralized control circuit. The required control logic is advantageously distributed among the nodes, such that no centralized controller is necessary. Moreover, it is unnecessary to design/fabricate an extensive low skew clock tree across a large die area, thereby advantageously simplifying the physical implementation of the network. In addition, the ring network 100 can be operated at a high frequency with minimal latency.

As described above, client logic within nodes N0-N5 controls the flow of messages on message bus 102. Because the average bandwidth of a ring network is 2 (bisectional bandwidth), bandwidth allocation policies and flow control logic are necessarily included within the client logic of each node. Several well-known techniques, such as round robin or credit-based schemes, can be used by the bandwidth allocation and flow control circuit within each node. In accordance with the description provided above, the bandwidth allocation and flow control logic of each node will operate in the client logic clock domain, and therefore can operate at a different frequency than the reference clock signal CK_REF of the ring network clock domain.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

The invention claimed is:

1. A ring network comprising:
a plurality of nodes, including a root node and one or more branch nodes,
wherein the root node is coupled to receive a reference clock signal;
a circular clock signal path that routes the reference clock signal from the root node, through each of the one or more branch nodes, and back to the root node; and
a circular message path that extends in parallel with the circular clock signal path,
wherein the root node and the one or more branch nodes transmit messages on the message path,
wherein each of the plurality of nodes includes corresponding node logic that latches messages received on the message path in response to the reference clock signal received on the clock signal path,
wherein each node of the plurality of nodes introduces a corresponding node delay with respect to the reference clock signal when transmitting messages,
wherein the clock signal path includes a delay line within each of the plurality of nodes,
wherein each delay line introduces a delay to the reference clock signal on the clock signal path after the corresponding node logic latches the messages received on the message path in response to the reference clock signal,
wherein the delay introduced by the corresponding delay line within each of the plurality of nodes is selected based on the corresponding node delay.

2. The ring network of claim 1,
wherein messages are transmitted on the message path in a unidirectional manner.

3. The ring network of claim 1,
wherein the reference clock signal is the only clock signal used for the synchronization of the transmitted messages on the message path.

4. The ring network of claim 1,
wherein each of the plurality of nodes includes client logic that operates in a local clock domain defined by a corresponding local clock signal.

5. The ring network of claim 4,
wherein the reference clock signal has a higher frequency than each local clock signal.

6. The ring network of claim 4, further comprising synchronization circuitry that enables communications across the first clock domain and the local clock domain within each of the plurality of nodes.

7. The ring network of claim 1,
wherein each of the plurality of nodes further includes a corresponding timestamp counter.

8. The ring network of claim 7, further including means for initializing the timestamp counter in each of the plurality of nodes.

9. The ring network of claim 8,
wherein each of the plurality of nodes further including means for incrementing the corresponding timestamp counter in response to originating an ordered message and in response to receiving an ordered message from another node,
wherein each ordered message addresses a particular one of the plurality of nodes.

10. The ring network of claim 1,
wherein each of the plurality of nodes includes a color bit register that stores a color bit value that is toggled by a pulse message that continuously traverses the circular message path.

11. The ring network of claim 1,
wherein each of the plurality of nodes includes a node identification register that stores a unique node identifier address.

12. The ring network of claim 1,
wherein each of the plurality of nodes includes a corresponding message snooper that stores ordered messages received on the message path.

13. The ring network of claim 1,
wherein each of the plurality of nodes includes means for arbitrating a priority of a plurality of ordered messages received on the message path.

14. The ring network of claim 1,
wherein the delay of each delay line is adjustable.

15. The ring network of claim 1,
wherein the root node includes a resynchronization circuit that receives messages on the message path, and resynchronizes the received messages with the reference clock signal.

16. The ring network of claim 1, wherein each of the plurality of nodes further includes:
a corresponding timestamp counter that stores a corresponding timestamp value;
means for incrementing the corresponding timestamp counter in response to originating an ordered message and in response to receiving an ordered message from another node, wherein each ordered message addresses a particular one of the plurality of nodes;
means for appending the corresponding timestamp value to each ordered message generated by the node;
a corresponding message snooper that stores ordered messages received on the message path; and
a corresponding color bit register that stores a corresponding color bit value that is toggled by a pulse message that continuously traverses the circular message path;
means for arbitrating a priority of a plurality of ordered messages stored in the corresponding message snooper in response to the corresponding color bit value being toggled, wherein priority is awarded based on timestamp values appended to the plurality of ordered messages.

* * * * *